(12) United States Patent
Humbs et al.

(45) Date of Patent: Aug. 2, 2005
(10) Patent No.: US 6,924,504 B2

(54) ORGANIC LIGHT EMITTING DIODE AND METHOD FOR PRODUCING THE SAME

(75) Inventors: Werner Humbs, Berlin (DE); Albrecht Uhlig, Berlin (DE); Marcus Schädig, Berlin (DE)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/913,521

(22) Filed: Aug. 9, 2004

(65) Prior Publication Data

US 2005/0012093 A1 Jan. 20, 2005

Related U.S. Application Data

(63) Continuation of application No. 10/317,166, filed on Dec. 12, 2002, now Pat. No. 6,774,392.

(30) Foreign Application Priority Data

Apr. 10, 2002 (DE) .......................................... 102 15 702

(51) Int. Cl.⁷ ............................................... H01L 51/00
(52) U.S. Cl. ......................................... 257/40; 257/103
(58) Field of Search ..................... 257/40, 103; 438/99, 438/22; 313/504

(56) References Cited

U.S. PATENT DOCUMENTS 6,087,196 A 7/2000 Sturm et al. ................... 438/29
6,297,589 B1 * 10/2001 Miyaguchi et al. ......... 313/504
6,610,552 B2 * 8/2003 Fujimori et al. .............. 438/22

FOREIGN PATENT DOCUMENTS

| EP | 0423283 | 4/1991 | |
|----|---------|--------|---|
| EP | 0908725 | 4/1999 | |
| EP | 0940796 | 9/1999 | |
| EP | 0940797 | 9/1999 | |
| EP | 0989778 | 3/2000 | |
| JP | 2001 230073 | 8/2001 | ........... H05B/33/06 |
| WO | WO 9013148 | 11/1990 | |
| WO | WO 9828946 | 7/1998 | |
| WO | WO 9943031 | 8/1999 | |
| WO | WO 9966483 | 12/1999 | |
| WO | WO 0012226 | 3/2000 | |
| WO | WO 0019776 | 4/2000 | |

\* cited by examiner

*Primary Examiner*—Sara Crane
(74) *Attorney, Agent, or Firm*—McGuireWoods LLP

(57) ABSTRACT

An organic light emitting diode (OLED) includes a substrate having a first electrode layer formed thereon in a predetermined pattern, an insulator layer defining the upper portion of the substrate having the first electrode layer in a predetermined pattern, an organic polymer layer formed based on the pattern defined by the insulator layer, a barrier for blocking flow of the organic polymer layer at both ends of the pattern defined by the insulator layer, and a second electrode layer formed on the organic polymer layer.

6 Claims, 5 Drawing Sheets

ORGANIC LIGHT EMITTING DIODE AND METHOD FOR PRODUCING THE SAME

CROSS REFERENCE

This application is a continuation application of Applicant's U.S. patent application Ser. No. 10/317,166 filed on Dec. 12, 2002, now U.S. Pat. No. 6,774,392, which is herein specifically incorporated by reference in its entirety.

BACKGROUND OF THE INVENTION

1. Field of the Invention

The present invention relates to an organic light emitting diode (OLED) for realizing a full-color display device, and more particularly, to a polymer OLED and a method for producing the same.

2. Description of the Related Art

OLEDs which can realize full-color display devices are largely divided into two types: OLEDs employing low molecular weight materials; and OLEDs employing polymer high molecular weight materials.

A high molecular weight OLED is generally fabricated such that two opposite electrodes, a cathode and an anode, are disposed on a substrate. A hole transport layer (HTL) and an emission layer are provided between the anode and the cathode. In the polymer high molecular weight OLED, the HTL and the emission layer are formed of organic polymers. Recently, research into polymer OLEDs has been actively carried out because they drive at a relatively lower voltage, consume a relatively small amount of power and can easily realize large, full-color display screens.

Organic layers, both as active and passive matrix types on the basis of polymer OLEDs, are fabricated according to the state of the art with printing techniques such as ink-jet printing.

In this known method, the light emitting polymers are liquefied to a so-called polymer ink. The polymer ink is printed onto a substrate via an ink-jet printing head.

The OLED, in the simplest case of a passive matrix display screen, is fabricated as follows.

First, a transparent substrate made from glass or plastic is coated with a transparent conductor material such as indium tin oxide (ITO) to form an anode having a predetermined pattern.

In a next step, a hole transport layer (HTL) is formed of an organic material, for example, poly-(2,4)-ethylene-dihydroxy thiophene (PEDOT) or polyaniline (PANI) on the anode. The HTL is applied onto the anode on the substrate by means of ink-jet printing or spin coating.

A polymer emission layer is then formed on the organic HTL by the ink-jet printing method as mentioned above. In order to obtain a full-color display screen, a red-emitting, a green-emitting and a blue-emitting polymer is imprinted on the organic HTL. Following this, a cathode, formed from a layer of calcium and a layer of aluminium, is vapour-deposited over the polymer emission layer.

Finally, the entire structural element is encapsulated. The cathode and the anode are then connected to a driving electronic system.

In order to print the polymers for each pixel in a predetermined lattice or line array, a structure is formed of an organic or inorganic substance, such as a photo-resist as shown in FIGS. 1A and 1B. The photo-resist structure forms the peripheral zone of the pixels for pixels that are lattice-patterned. If the pixels are line-patterned, the photo-resist structure forms the left and right boundary limitations of the lines.

FIGS. 1A and 1B shows a portion of the structure of an OLED without organic polymers layers. A first electrode layer 2 having a predetermined pattern is formed on a glass substrate 1. A first insulator layer 3 made from the photo-resist, and a second insulator layer 4 forming channels 40, are formed on the first electrode layer 2. Predetermined openings 31 are formed in the first insulator layer 3 by exposing and developing steps so that a predetermined area of the first electrode layer 2 is exposed through the openings 31 to define pixels.

Referring to FIGS. 2A and 2B, polymer material layers, that is, a hole transport layer 5 and a polymer emission layer 6, are formed in the channels 40.

So-called multi-channel printing heads are used to obtain effective printing. With these printing heads, it is possible to simultaneously print a plurality of pixels. Accordingly, several jets of the printing head are provided. With a piezo-actuated printing head, the piezo actuators of various jets are activated with subsequent excitation of the drop formation from these various jets. For printing, the substrate is moved with constant speed opposite the printing head. In this case, the printing head prints into the lines or lattices of the pixels on the substrate in accordance with the number of active jets of the printing head. As shown in FIGS. 2A and 2B, the lines or lattices are printed into the channels pre-structured by the second insulator layer 4. The second insulator layer 4 ensures that the polymer ink does not flow into neighbouring channels. In this way, red, green and blue emitting polymers can be printed in a line-shaped manner next to each other without causing any mixing of colours.

The fabrication of organic light emitting diodes on a polymer basis is described in the patents EP 0423283 and WO 9013148. The fabrication of OLEDs by means of printing methods, such as ink-jet printing, is described in the patents EP 0908725, EP 0940796, EP 0940797, EP 0989778, WO 9943031, WO 9966483, WO 9828946, U.S. Pat. No. 6,087,196, WO 0012226, and WO 0019776.

The fabrication of photo-resist structures is described in the EP 0996314 A1.

By the boundary limitation of the various rows or columns of a full-color display screen using an insulator layer, e.g., photo-resist, it is ensured that HTL ink as well as polymer ink can be printed into the pre-structured channels. In this way, red, green and blue emitting polymers can be printed in a lattice or line array next to each other without polymer flowing into the neighbouring channels or causing a mixing of colors in the process. In other words, it is ensured that no ink can flow over this photo-resist barrier and into the neighbouring lines. The limiting photo-resist structures form the channels, and form lattice or line arrays on the substrate that is then built up to the full-colour display screen.

As shown in FIGS. 2A and 2B, the channels are open at the upper and lower rims. The photo-resist structures only provide lateral border limitations for the channels. The HTL ink and the polymer ink can easily run out from the upper and lower rims of the opened channels. Therefore, the amount of ink at the upper and lower rims of the channels is less than that at central portions of the channels. Accordingly, after the HTL ink and the polymer ink are dried, the HTL and the emission layer exhibit nonuniformity in layer thickness at the upper and lower rims thereof, which are effective areas for electro-luminescence emission. This occurs because the layer thicknesses of the HTL- and polymer emission layer gradually become thinner due to the HTL ink and polymer ink running out from the ends or rims of the channels.

SUMMARY OF THE INVENTION

To solve the above-described problems, it is an object of the present invention to provide an organic light emitting diode (OLED) which can prevent ink from a hole transport layer (HTL) or polymer layer from running out from channels and in which the HTL or polymer layer has a uniform layer thickness.

To achieve the above object, the present invention provides an organic light emitting diode (OLED) including a substrate having a first electrode layer formed thereon in a predetermined pattern, an insulator layer formed on the first electrode layer in a predetermined pattern, an organic polymer layer formed on the pattern defined by the insulator layer, a barrier for blocking flow of the organic polymer layer at the ends of the pattern defined by the insulator layer, and a second electrode layer formed on the organic polymer layer.

In accordance with another aspect of the present invention, the insulator layer may include a first insulator layer formed on the first electrode layer and having openings to partially expose the first electrode layer, and a second insulator layer formed on the first insulator layer and having the pattern defined thereon.

Also, the shape of the barrier is one of a cuboid, a cylinder and a pyramid.

In another aspect of the present invention, the width of the barrier is equal to or smaller than the width of the pattern of the second insulator layer.

In still another aspect of the present invention, the height of the barrier is greater than or equal to 50 nm.

Also, the height of the barrier may be greater than 1 $\mu$m and smaller than the height of the insulator layer.

The barrier may be made of an insulator material.

Also, the present invention provides a method for producing an organic light emitting diode (OLED) including forming a first electrode layer on a substrate in a predetermined pattern, forming a channel on the first electrode layer using an insulator material where both ends of the channel are defined by a barrier, forming an organic polymer layer on the pattern defined by the insulator layer by applying a liquid-phase organic polymer into the channel, forming a second electrode layer on the organic polymer layer, and sealing the substrate.

In accordance with another aspect of the present invention, the step of applying a liquid-phase organic polymer into the channel is performed by ink-jet printing technique, and the width of the barrier is equal to or smaller than the width of the pattern of the second insulator layer.

BRIEF DESCRIPTION OF THE DRAWINGS

The above object and advantages of the present invention will become more apparent by describing in detail preferred embodiments thereof with reference to the attached drawings.

DETAILED DESCRIPTION OF THE INVENTION

Figure 1A:
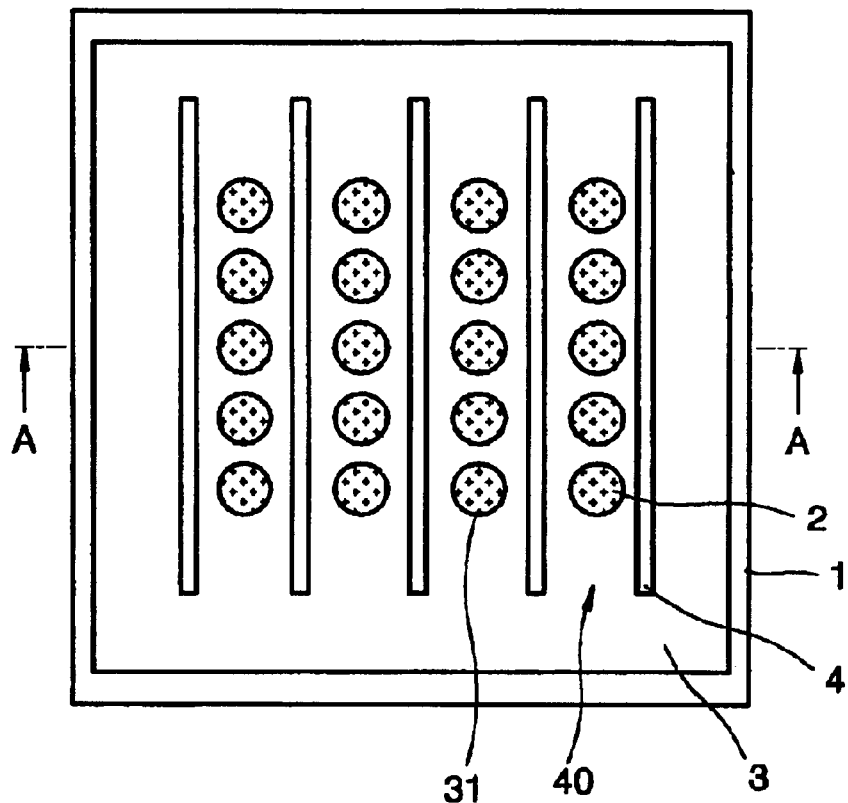
FIGS. 1A and 1B are a plan view and a cross-sectional view taken along the line A—A of a passive matrix substrate for a conventional polymer OLED.

Preferred embodiments of the present invention will now be described in detail with reference to the accompanying drawings. An explanation will be given with the example of a passive matrix type polymer OLED. Although not shown in the drawings, the invention can also be applied to active matrix type polymer OLED.

Figure 3A:
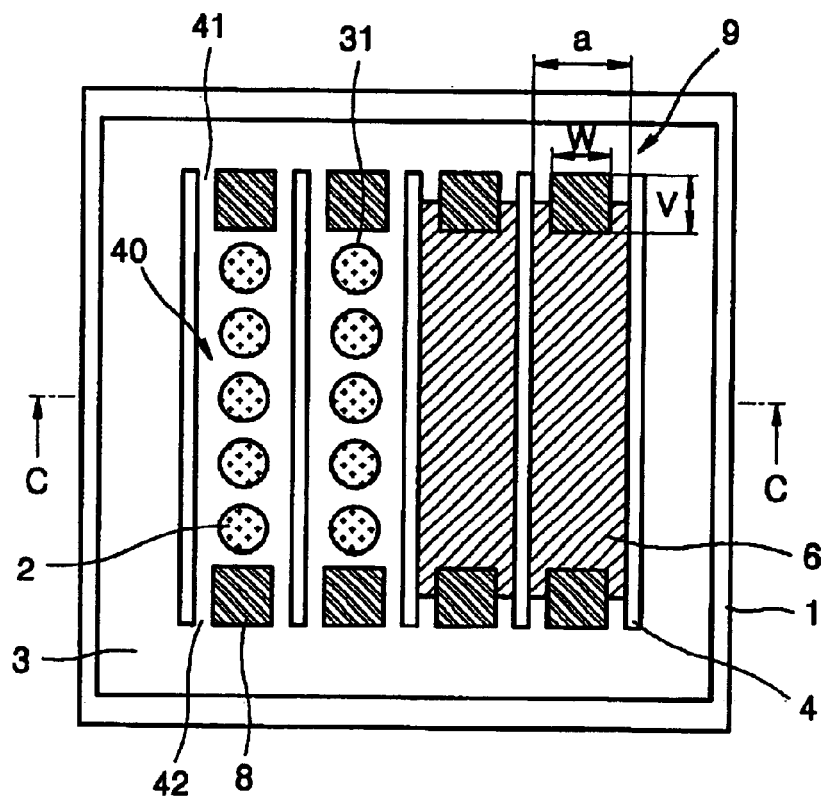
FIGS. 3A and 3B are a plan view and a cross-sectional view taken along the line C—C, showing the structure of a substrate for a polymer OLED according to one embodiment of the invention and the state in which HTL ink and polymer ink are printed onto the same.
Figure 3B:
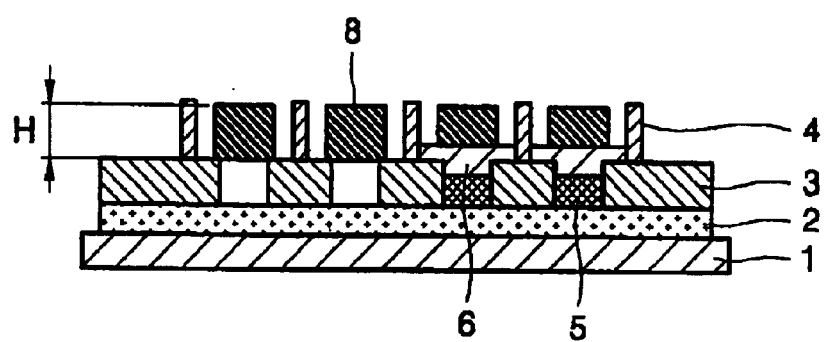

FIGS. 3A and 3B show the state in which HTL ink and polymer ink are printed onto a substrate according to one embodiment of the invention.

Figure 1B:
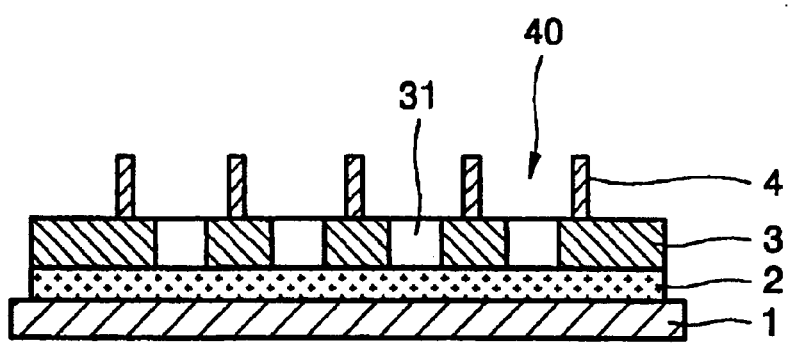
Figure 2A:
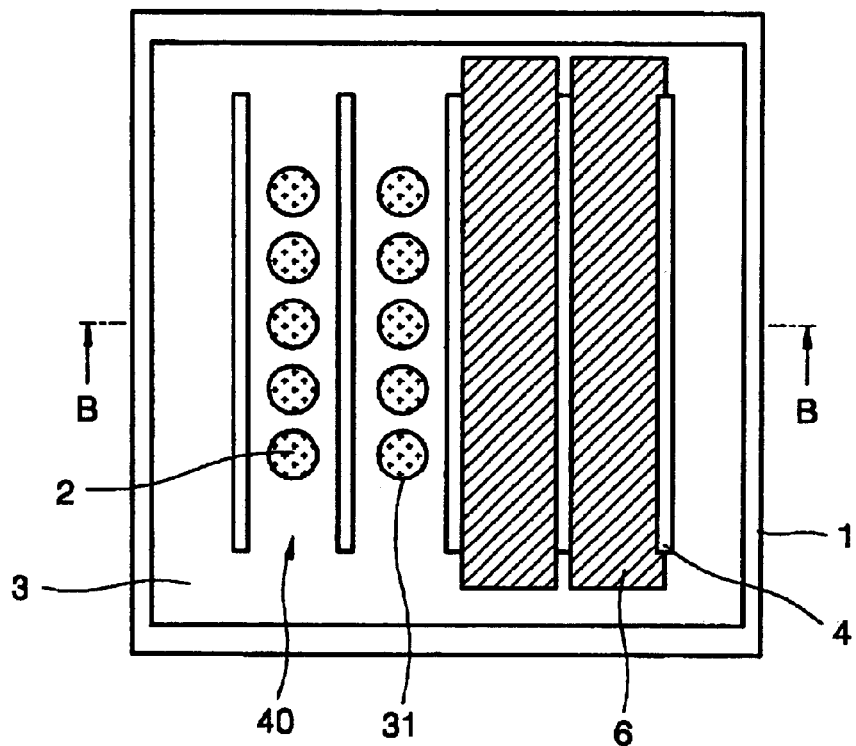
FIGS. 2A and 2B are a plan view and a cross-sectional view taken along the line B—B, showing the state in which HTL ink and polymer ink are printed onto the passive matrix substrate shown in FIG. 1.
Figure 2B:
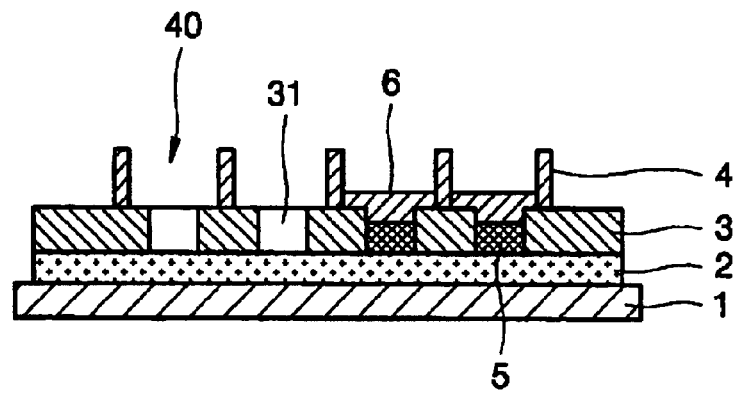

The structure of the substrate shown in FIGS. 3A and 3B is substantially the same as that of the conventional substrate shown in FIGS. 1A and 1B. The same elements are denoted by the same reference numerals.

Referring to FIGS. 3A and 3B, a first electrode layer 2 is formed above a substrate 1 formed of a general glass plate. The first electrode layer 2 may be formed of a transparent conductor material, e.g., ITO. Although not shown, the first electrode layer 2 may be patterned in a predetermined pattern. The distance between two neighbouring patterns of the first electrode layer 2 is typically about 80 $\mu$m. The first electrode layer 2 functions as an anode.

An insulator layer made of an organic or inorganic insulator material is formed over first electrode layer 2 in a predetermined pattern. An organic polymer layer is formed in the pattern defined by the insulator layer.

In the OLED according to one embodiment of the present invention, the insulator layer includes a first insulator layer 3 and a second insulator layer 4, as shown in FIGS. 3A and 3B. The first insulator layer 3 has openings 31 to partially expose the first electrode layer 2. The second insulator layer 4 is formed on the first insulator layer 3 in a predetermined pattern.

In the present invention, the first insulator layer 3 is preferably an acryl photo-resist formed by known methods such as spin coating, followed by performing exposure and development, thereby forming the openings 31. Predetermined portions of the first electrode layer are exposed by the openings 31, thereby defining pixels.

The first insulator layer 3 may have a thickness ranging from about 100 to about 500 nm. The openings 31 formed in the first insulator layer 3 are preferably shaped to be circular (approximately 20 $\mu$m in radius) or rectangular (approximately 40×140 $\mu$m in surface area).

After forming the first insulator layer 3, the second insulator layer 4 made of a photo-resist is subjected to spin coating, followed by performing exposure and development, thereby forming cuboid-shaped structures. Preferable dimensions of these cuboids may range from about 1 to about 5 $\mu$m in height, and from about 5 to about 20 $\mu$m in width. The depths of the cuboids may range from several millimeters to centimeters depending on the length of the diode. In certain preferred embodiment, the cuboids of the second insulator layer 4 are arranged in parallel to each other and are positioned parallel to and in the center between each of the respective rows of the openings 31. In this way, the channels 40 for the HTL- or polymer ink are formed.

These channels limit the individual rows of red, green and blue pixels and prevent ink from flowing into neighbouring channels. According to the invention, barriers 8 are formed at the upper and lower ends 41 and 42 of the channels 40. In some embodiments, barriers 8 are preferably formed of a photo-resist material.

Each of the barriers 8 of the invention should have a height at which the HTL- or polymer ink can be prevented from flowing out toward the upper and lower ends 41 and 42 of the channels 40. For example, when the height of the HTL 5 is approximately 50 nm and the height of the polymer emission layer 6 is approximately 100 nm, the height of the barrier 8 is preferably at least about 50 nm.

The height of the barrier 8 is preferably, but not necessarily, the same as that of each channel 40.

In a preferred embodiment of the present invention, the height of the barrier 8, denoted by H as shown in FIGS. 3A and 3B, is greater than about 1 $\mu$m, but is not greater than that of the second insulator layer 4. Thus, the height H can be set to be in the range of about 1 to about 5 $\mu$m. The vertical length of the barrier 8, denoted by V, can be set to be in the range of about 5 to about 20 $\mu$m. Assuming that the width of the barrier 8 is denoted by W and the distance between two neighbouring second insulator layers 4 is denoted by a, the width of the barrier 8 can be set such that 5 $\mu$m$\leq$W$<$a.

Although not shown in the drawing, when the barrier is shaped of a circle having a diameter D, the size of the barrier may be satisfied such that 1 $\mu$m$\leq$H$\leq$5 $\mu$m and 5 $\mu$m$\leq$D$<$a.

As described above, the height and width of the barrier 8 can be adjusted independently. In other words, the width of the barrier 8 is possibly less than the entire width of the line to be printed. This is advantageous because, in a further fabrication step, a cathode formed from a second electrode layer 10 made of metal is easily coated over the printed ink layers 5 and 6 (FIGS. 4A and 4B).

Figure 4A:
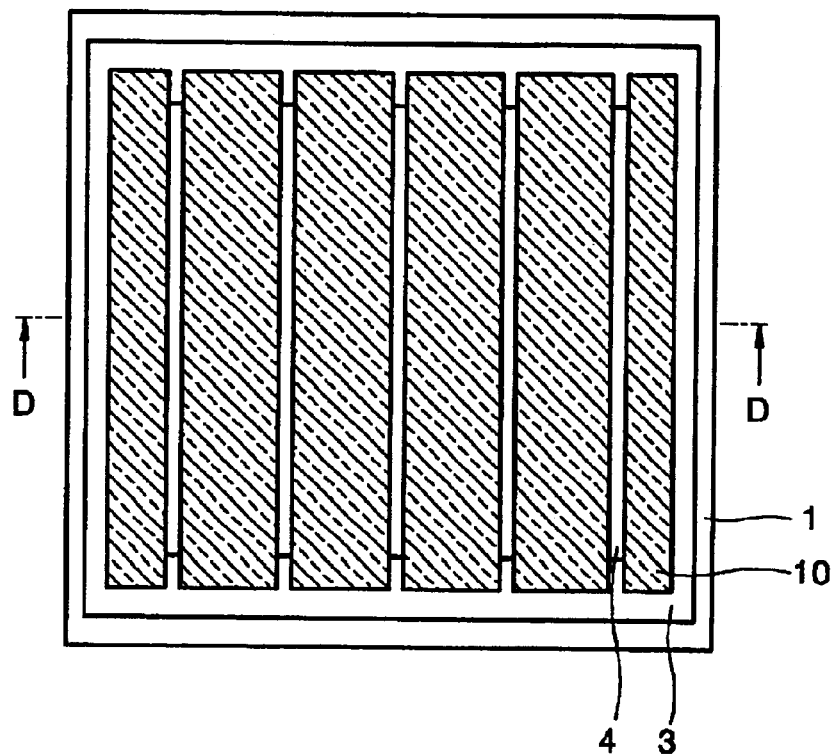
FIGS. 4A and 4B are a plan view and a cross-sectional view taken along the line D—D showing the state in which a second electrode layer is formed on the substrate shown in FIGS. 3A and 3B.
Figure 4B:
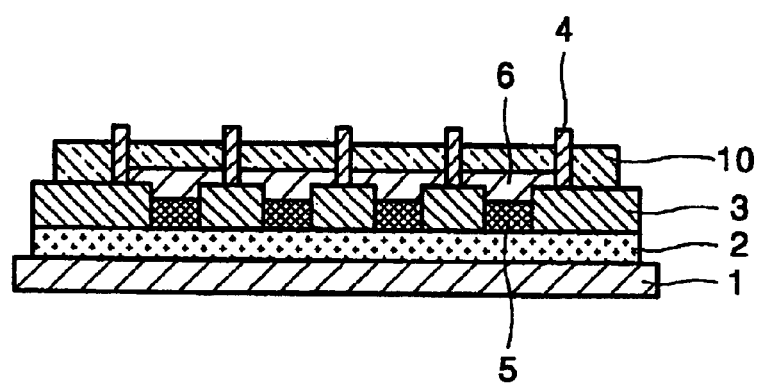

As shown in FIGS. 4A and 4B, the second electrode layer 10 is normally formed of a second electrode layer 10 with a layer thickness ranging from about 50 nm to a few $\mu$m. This metal film is brought into contact with a driver (not shown) disposed outside the printed lines. If the metal film were now to end at the edge of the barrier 8, then there would be no contact between the second electrode layer 10 and the printed ink line at a portion where the barrier 8 is formed.

Subsequently, there would be a related emission loss from this line. The line would be seen on the display screen as an erroneous black line. However, as the barrier 8 can be arranged in such a way that a zone between the channel and the barrier 8 remains free, the second electrode layer 10 cannot be isolated from this location and a contact between the driver and the printed line is ensured. The ink cannot run out of the channels because the surface of the barrier 8 is subjected to a predetermined treatment. In other words, in a state in which the angle of contact between the ink and the barrier 8 is made to be greater than 30°, a leak between the second insulator layer 4 and the barrier 8 is prevented, e.g., by means of plasma treatment.

The barriers 8, as shown in FIGS. 3A and 3B, are formed from photo-resist cuboid structures and are located at both ends 41 and 42 of each channel 40 (P/R cuboids), thereby forming lower and upper limits of the channels. In this case, the barriers 8 are not directly adjacent to the neighbouring second insulator layer 4, but have a clearance 9. The barriers 8 also have a clearance from the openings 31 adjacent thereto.

In order to produce the repelling effect of the channel walls 4 as well as that of the barriers 8 against the HTL- and the polymer ink, the insulating layers 3 and 4 formed on the electrode layer 2 and substrate 1 is surface-treated in a next step. Here, the repelling effect is attained by a microwave plasma treatment in the presence of a $CF_4/O_2$ gas mixture for 30 to 120 seconds.

The HTL 5 and the polymer layer 6 are applied by known methods such as piezo ink-jet printing. With this method, the ink-jet head is positioned opposite to the insulating layers 3 and 4 such that the first drop of the HTL ink and/or polymer ink is positioned in the center of a channel at a clearance having a diameter corresponding to one drop of ink from the upper barrier 8.

By means of continuous pressing and displacement of the insulating layers 3 and 4 against the head, the channel is filled with the HTL ink and polymer ink. The printing is stopped when the last drop of ink has a clearance having a diameter corresponding to one drop from the lower barrier 8. After forming the HTL 5 and prior to forming the polymer layer 6, the substrate 1 with the HTL 5 printed in insulating layers 3 and 4 is subjected to a heat treatment for approximately 10 minutes at 130° C. in an oven in order to dry the HTL ink.

In a next step, the second electrode layer 10 is vapour-deposited with a metal over the insulating layers 3 and 4, and the HTL 5 and polymer layer 6. Calcium and aluminium can be used for the second electrode layer 10. Here, known methods, e.g., thermal evaporation, are employed as the deposition method, and the second electrode layer 10 is deposited in a typical layer thickness ranging from about 1 to about 100 nm (Ca) and about 200 to about 2000 nm (Al). The second layer 10 functions as a cathode.

Figure 5A:
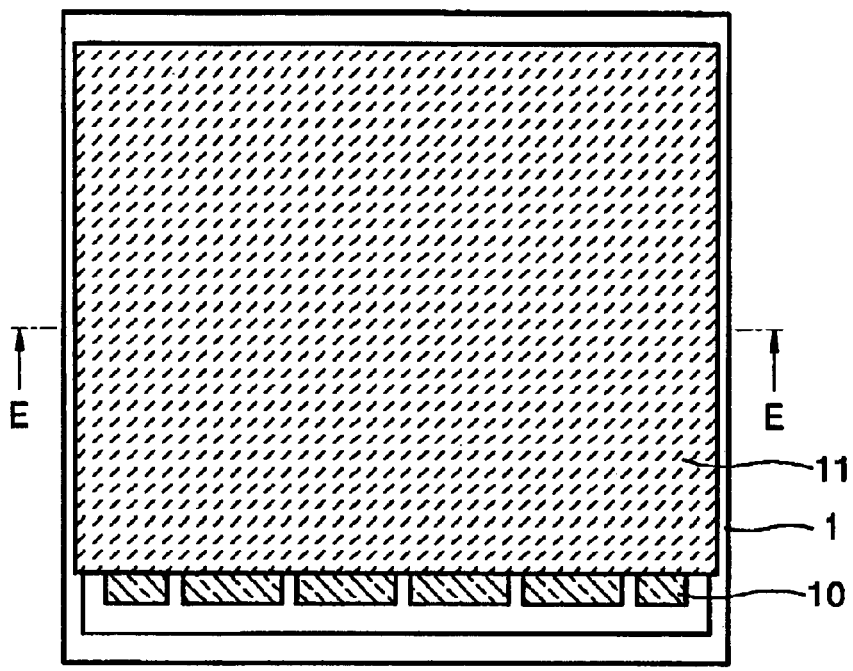
FIGS. 5A and 5B are a plan view and a cross-sectional showing the state in which the substrate shown in FIGS. 4A and 4B is encapsulated.
Figure 5B:
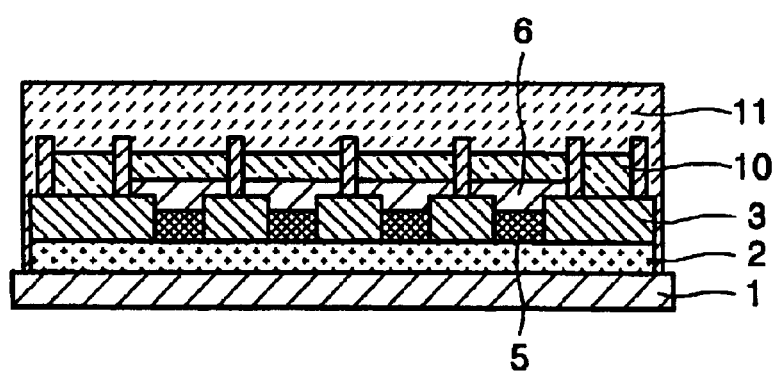

Finally, as shown in FIGS. 5A and 5B, the assembled substrate having the substrate 1, the electrode layer 2, the insulating layers 3 and 4, the HTL 5, the organic polymer layer 6, and the second electrode layer is encapsulated by means of known techniques such as adhesion with a glass plate 11 so that oxygen, water and other materials restricting the function of the polymer OLED can be isolated from the assembled substrate.

As described above, the present invention has the following advantages.

First, a deviation in layer thickness in the entire channel is approximately ±10%, that is, the barrier according to the present invention effectively reduce the deviation in layer thickness, compared to the conventional case in which a deviation in layer thickness is approximately 50%.

Second, when the same power and/or current are applied to an OLED, the electroluminescence intensity of an emission layer depends upon thicknesses of a HTL and a polymer emission layer. Thus, the electroluminescence intensity within a channel is increased by installing a barrier.

Third, for the entire channels, uniformity in layer thickness and electroluminescence intensity can be enhanced.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An organic light emitting diode (OLED), comprising:
   a substrate having a first electrode layer formed thereon in a predetermined pattern;

an insulator layer formed on the first electrode layer, wherein the insulator layer forms a channel over the first electrode layer;

an organic polymer layer formed in the channel defined by the insulator layer;

a barrier for blocking flow of the organic polymer layer at each end of the channel of the insulator layer; and a second electrode layer formed on the organic polymer layer;

wherein the insulator layer comprises:

a first insulator layer formed on the first electrode layer and having an opening to partially expose the first electrode layer; and a second insulator layer formed on the first insulator layer and forming the channel.

2. The OLED of claim 1, wherein the barrier is one of a cuboid, a cylinder and a pyramid.

3. The OLED of claim 2, wherein the barrier is as wide as or narrower than the second insulator layer.

4. The OLED of claim 1, wherein the barrier is at least about 50 nm high.

5. The OLED of claim 1, wherein the barrier is at least about 1 $\mu$m high and lower than the insulator layer.

6. The OLED of claim 1, wherein the barrier is made of an insulator material.

* * * * *